(12) United States Patent
Choy (10) Patent No.: US 11,070,353 B1
(45) Date of Patent: Jul. 20, 2021

(54) COMBINED DECISION FEEDBACK EQUALIZER AND PHASE DETECTOR FOR CLOCK DATA RECOVERY

(71) Applicant: Diodes Incorporated, Milpitas, CA (US)

(72) Inventor: Kwok Wing Choy, Sunnyvale, CA (US)

(73) Assignee: Diodes Incorporated, Milpitas, CA (US)

( * ) Notice: Subject to any disclaimer, the term of this patent is extended or adjusted under 35 U.S.C. 154(b) by 0 days.

(21) Appl. No.: 16/741,391

(22) Filed: Jan. 13, 2020

(51) Int. Cl.
*H04L 7/033* (2006.01)
*H04L 7/00* (2006.01)
*G11C 7/06* (2006.01)
*G11C 7/22* (2006.01)

(52) U.S. Cl.
CPC ............ *H04L 7/0337* (2013.01); *G11C 7/065* (2013.01); *G11C 7/222* (2013.01); *H04L 7/0008* (2013.01); *H04L 7/0037* (2013.01)

(58) Field of Classification Search
CPC ... H04L 7/0337; H04L 7/0008; H04L 7/0037; G11C 7/222; G11C 7/065
USPC .................................................. 375/233, 376
See application file for complete search history.

(56) References Cited

U.S. PATENT DOCUMENTS

| | | | | |
|---|---|---|---|---|
| 9,036,764 B1* | 5/2015 | Hossain | ............... | H03L 7/0891 375/376 |
| 2007/0171968 A1* | 7/2007 | Frnaz | ............... | H03D 13/00 375/233 |
| 2008/0198916 A1* | 8/2008 | Zeng | ............... | H04L 25/03057 375/233 |
| 2013/0101011 A1* | 4/2013 | Shin | ............... | H04B 1/16 375/233 |
| 2017/0180002 A1* | 6/2017 | Kiran | ............... | H04B 1/0007 |

OTHER PUBLICATIONS

Horowitz, Mark, "High Speed Link Overview—Lecture 2", EE371 Lecture 2 (2007), 37 pages.

* cited by examiner

*Primary Examiner* — Fitwi Y Hailegiorgis
(74) *Attorney, Agent, or Firm* — Weaver Austin Villeneuve & Sampson LLP

(57) ABSTRACT

Clock and data recovery for high-speed serial data protocols is enabled using circuitry that combines the functionality of a decision feedback equalizer with that of a phase detector.

22 Claims, 5 Drawing Sheets

COMBINED DECISION FEEDBACK EQUALIZER AND PHASE DETECTOR FOR CLOCK DATA RECOVERY

BACKGROUND

In the context of high-speed serial data communication, one type of clockless re-timer includes a continuous-time linear equalizer (CTLE), a decision feedback equalizer (DFE), and a clock data recovery (CDR) loop that includes an Alexander phase detector, a loop filter, and a voltage-controlled oscillator (VCO). The incoming data signal passes through the CTLE to recover the data "eye." The DFE is intended to further clean up the post-cursor data before processing by an Alexander phase detector of the CDR loop. A variety of issues arise with this design both before and after the CDR loop locks to the incoming data.

Before the CDR loop locks, the clock signal generated by the CDR loop moves around as the CDR loop attempts to lock to the data. This variation in the clock causes incorrect sampling by the DFE which, in turn, causes the phase detector to incorrectly determine data. Without the correct data, the CDR loop cannot properly lock. And before the CDR loop locks, the output of the DFE cannot be used by the CDR loop. To get around this issue, a conventional CDR loop uses the output of the CTLE, thus losing the benefit of the DFE.

After the CDR loop locks, a clock phase issue arises. The DFE uses a delayed version of the clock generated by the CDR loop. This delayed version of the clock must remain constant across process, temperature, and supply voltage variations. Unfortunately, this not achievable using conventional delay cells, thus reducing the effectiveness of the DFE.

In addition, implementing the DFE with a summing node is challenging for high data rates because the first tap in the DFE has to settle within one bit duration across all process, temperature, and supply variations. A variety of architectures have been developed to address this issue with an undesirable increase in circuit complexity and die size.

One design known as a one-tap loop un-roll DFE (LUDFE) removes the summing node and uses a predictive approach in which the outcome of the next bit is pre-computed, and the current bit is used to select the pre-computed bit, thus relaxing the timing requirements. However, this architecture does not address the other issues described above.

SUMMARY

According to a particular class of implementations, circuits and devices are enabled that include first decision feedback equalizer (DFE) circuitry configured to receive an input signal and generate a first intermediate data signal, and second DFE circuitry configured to receive the input signal and generate a second intermediate data signal. Phase detector circuitry is configured to receive the first and second intermediate data signals and generate three phase difference signals using a clock signal derived from the input signal. The three phase difference signals represent three samples of the input signal corresponding to three consecutive transitions of the clock signal. Operation of the first DFE circuitry, the second DFE circuitry, and the phase detector circuitry is synchronized using the clock signal.

According to a specific implementation of this class, the phase detector circuitry includes a first flip-flop and a second flip-flop connected in series. The first flip-flop is configured to generate a first one of the phase difference signals based on the first intermediate data signal. The second flip-flop is configured to generate a second one of the phase difference signals based on the first phase difference signal. The phase detector also includes a third flip-flop configured to generate a third one of the phase difference signals based on the second intermediate data signal.

According to a specific implementation of this class, the second DFE circuitry is clocked with the clock signal, and the first DFE circuitry is clocked with an inverted version of the clock signal.

According to a specific implementation of this class, the circuit or device includes logic configured to receive the three phase difference signals and generate one or more timing signals representing relative timing of transitions of the clock signal and transitions of data encoded in the input signal.

According to a specific implementation of this class, the phase detector circuitry is part of clock and data recovery (CDR) circuitry, the CDR circuitry being configured to generate the clock signal. According to a more specific implementation, the CDR circuitry is configured to generate the clock signal such that a transition of the input signal representing an edge of a data bit is aligned with a first transition of the clock signal, and a second transition of the clock signal is aligned with a center of the data bit. According to another more specific implementation, the first DFE circuitry, the second DFE circuitry, and the phase detector circuitry are configured to generate the three phase difference signals whether or not the CDR circuitry is locked to data in the input signal.

According to a specific implementation of this class, the first DFE circuitry, the second DFE circuitry, and the phase detector circuitry are integrated in a single semiconductor die.

According to a specific implementation of this class, both the first DFE circuitry and the second DFE circuitry are configured to settle within one clock cycle of the clock signal.

According to a specific implementation of this class, the first DFE circuitry is configured to settle within one-half clock cycle of the clock signal, and the second DFE circuitry is configured to settle within one clock cycle of the clock signal.

According to a specific implementation of this class, the phase detector circuitry includes a first flip-flop and a second flip-flop connected in series. The first flip-flop is configured to generate a first one of the phase difference signals based on the first intermediate data signal. The second flip-flop is configured to generate a second one of the phase difference signals based on the first phase difference signal. The phase detector also includes a third flip-flop and a fourth flip-flop connected in series. The third and fourth flip-flops are configured to generate a third one of the phase difference signals based on the second intermediate data signal.

A further understanding of the nature and advantages of various implementations may be realized by reference to the remaining portions of the specification and the drawings.

BRIEF DESCRIPTION OF THE DRAWINGS

FIGS. 3(*a*) and 3(*b*) depict examples of waveforms associated with the phase detector of FIG. 2.

DETAILED DESCRIPTION

Reference will now be made in detail to specific implementations. Examples of these implementations are illustrated in the accompanying drawings. It should be noted that these examples are described for illustrative purposes and are not intended to limit the scope of this disclosure. Rather, alternatives, modifications, and equivalents of the described implementations are included within the scope of this disclosure as defined by the appended claims. In addition, specific details may be provided in order to promote a thorough understanding of the described implementations. Some implementations within the scope of this disclosure may be practiced without some or all of these details. Further, well known features may not have been described in detail for the sake of clarity.

Examples of transmission protocols used to transmit serial data between connected devices include the DisplayPort standard, the High-Definition Multimedia Interface (HDMI) standard, the Serial ATA standard, the Peripheral Component Interconnect Express (PCI-E) standard, and the Universal Serial Bus (USB) standard. The present disclosure enables clock and data recovery in systems employing such protocols using circuitry that combines the functionality of a decision feedback equalizer (DFE) with that of a phase detector (PD).

Figure 1A:
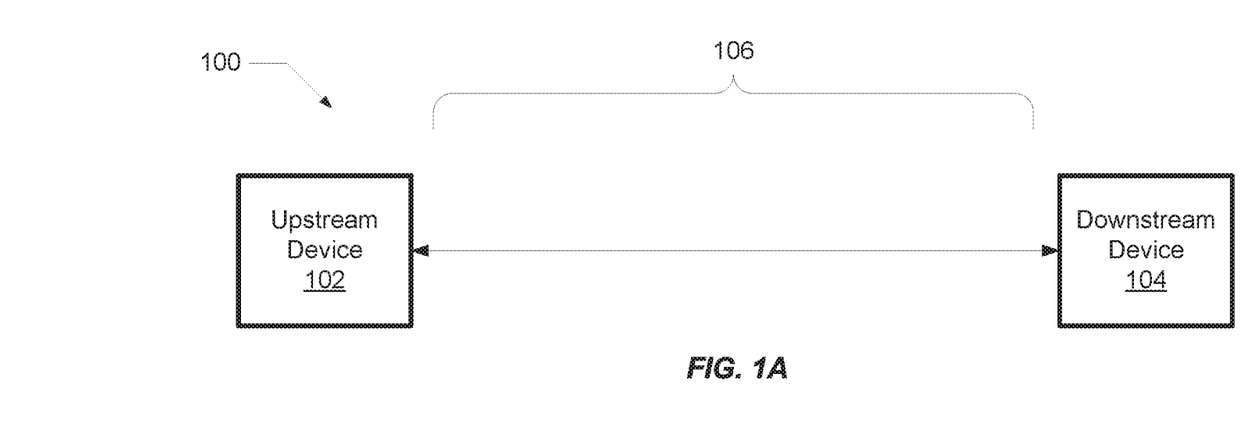
FIG. 1A is a simplified block diagram of a serial data transmission system.

FIG. 1A is a block diagram depicting an example of an implementation of a serial bus communication system 100. Serial bus communication system 100 includes upstream device 102, downstream device 104, and serial bus 106. It should be appreciated that serial bus communication system 100 may be a bidirectional communication system, where the upstream device 102 is capable of both transmitting and receiving, and the downstream device 104 is capable of both transmitting and receiving. In bidirectional communication systems, both upstream device 102 and downstream device 104 may include a combined DFE/PD circuitry enabled by the present disclosure for implementing clock and data recovery circuitry.

It should also be appreciated that bidirectional implementations of serial bus communication system 100 may include full-duplex implementations with one or two clock and data recovery circuits (depending on the re-use of resources using multiplexers), and half-duplex implementations with one clock and data recovery circuit and switching interfaces for the transmit and receive ports. It should further be appreciated that serial bus communication system 100 may be a unidirectional communication system, in which upstream device 102 is capable of transmitting and downstream device 104 is capable of receiving. In unidirectional communication systems, the receiver includes a combined DFE/PD enabled by the present disclosure.

Figure 1B:
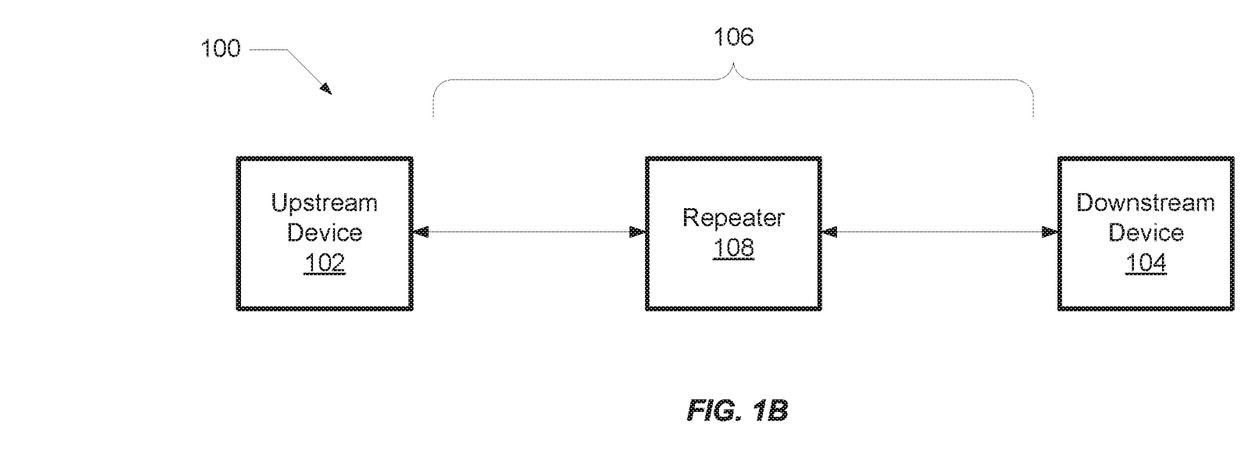
FIG. 1B is a simplified block diagram of a serial data transmission system including a repeater.

FIG. 1B is a block diagram depicting an example in an implementation where serial bus 106 includes one or more intermediary signal conditioning devices (singly and collectively "repeater 108") coupled in series, with the number of such devices depending on trace or cable length of the serial bus. Repeater 108 may be used as a serial link driver interface for serial bus 106, or multiple repeaters 108 may be used to provide a serial link driver interface for serial bus 106. Additionally, it should be appreciated that serial bus 106 includes traces or cables formed in or using a transmission medium such as conductive material or other means for propagating electric signals. It should also be appreciated that for implementations in which multiple repeaters 108 are used, one or more of the multiple repeaters may be a repeater including a combined DFE/PD enabled by the present disclosure. It should further be appreciated that implementations of serial bus communication system 100 including one or more repeaters may be full-duplex bidirectional, half-duplex bidirectional, or unidirectional as described for FIG. 1A.

Upstream device 102 may be implemented in a larger device or system such as any in a variety of integrated circuits or devices including, but not limited to, input/output ("I/O") hubs, root complexes, servers, and laptop docking stations, among others. Furthermore, it should be appreciated that downstream device 104 may be embedded in a larger device or system such as any in a variety of peripheral devices including, but not limited to, hard disk drives, graphics cards, and daughter cards, among others. It should be appreciated that reference to upstream device and downstream device are for purposes of example, and the examples of upstream device 102 and downstream device 104 listed above can correspond to terminal communication devices for serial standards that do not utilize a host-slave or hierarchical topology.

Communication via serial bus 106 may use a differential or single-ended signaling protocol. For example, upstream device 102 may include a differential output driver (not shown) for providing a differential signal. Repeater 108, when present, processes an output transmission from upstream device 102 to provide such processed output transmission to another repeater or directly to downstream device 104. Downstream device 104 may include a differential input driver (not shown). There are many known differential digital signaling protocols that may be used with serial bus communication system 100 such as, for example, differential Stub-Series Terminated Logic ("SSTL"), differential High-Speed Transceiver Logic ("HSTL"), Low-Voltage Differential Signaling ("LVDS"), differential Low-Voltage Positive Emitter Coupled Logic ("LVPECL"), and Reduced Swing Differential Signaling ("RSDS") among other differential digital signaling protocols. Additionally, implementations are contemplated that use single-ended serial interface protocols such as, for example, Low Voltage Transistor-Transistor Logic ("LVTTL") such as used for PCI, and Low Voltage Complementary Metal Oxide Semiconductor ("LVCMOS"), among other single-ended serial interface protocols. Conventionally PCI uses an LVTTL input buffer and a push-pull output buffer.

As mentioned above, implementations enabled by the present disclosure employ circuitry for clock and data recovery that combine elements of a phase detector (PD) with elements of a decision feedback equalizer (DFE). An example of a conventional implementation of each of these circuits will therefore be described with reference to FIGS. 2-4.

Figure 2:
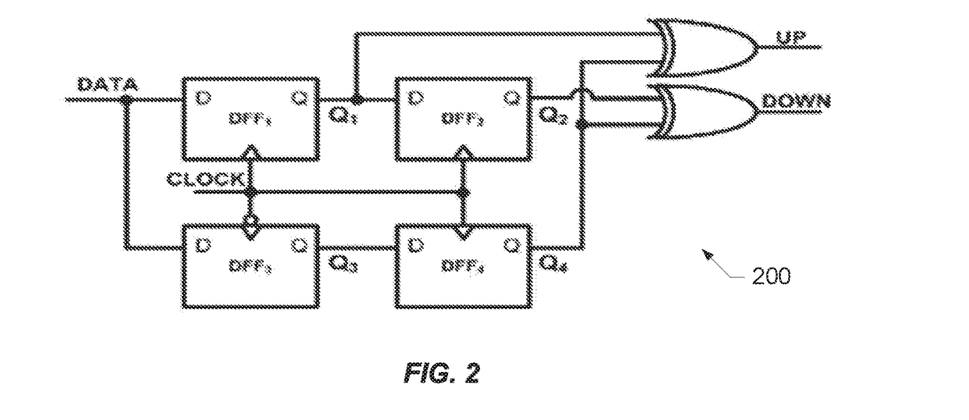
FIG. 2 is an example of a conventional phase detector.
Figure 3A:
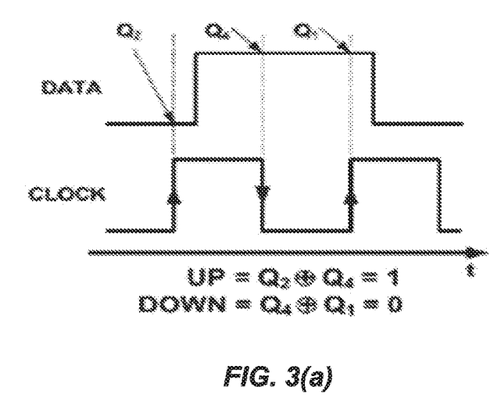
Figure 3B:
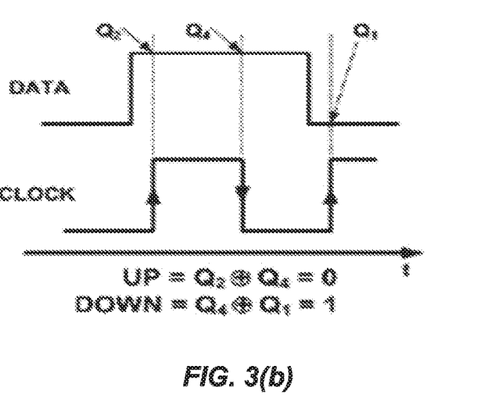

FIG. 2 is a simplified block diagram of a conventional Alexander phase detector 200 that compares transitions in a local CLOCK signal with those of an incoming DATA signal to determine whether the signals are out of phase and whether a positive or negative adjustment (UP or DOWN) to a voltage controlled oscillator (not shown) is needed to correct the phase difference. Phase detector 200 compares two pairs of data each clocked by two consecutive clock edges so that three data points for three consecutive clock edges are captured. By comparing the first two data and the last two data to determine whether the clock edge is early or late with respect to the data, the data captured by the second clock edge will align with the center of the data. FIG. 3(a) illustrates the situation in which the CLOCK signal is leading the DATA signal, i.e., an exclusive-or operation of Q2 and Q4 results in a "1" value for UP, and an exclusive-or operation of Q4 and Q1 results in a "0" value for DOWN. FIG. 3(b) illustrates the situation in which the CLOCK signal is lagging the DATA signal, i.e., the same operations result in a "0" for UP and a "1" for DOWN.

Figure 4:
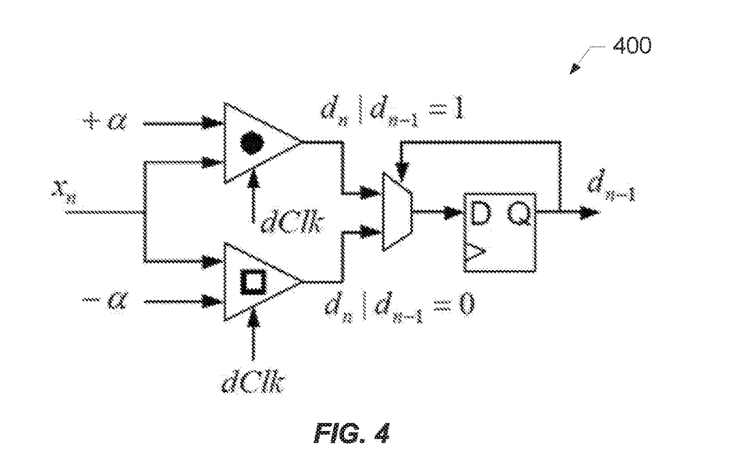
FIG. 4 depicts an example of a conventional loop unroll decision feedback equalizer (LUDFE).

FIG. 4 is a simplified block diagram illustrating operation of a so-called loop unroll decision feedback equalizer (LUDFE) 400. The LUDFE sets the thresholds for detection of 1s and 0s based on the previous bit value and using a which represents the data channel transmission characteristics (e.g., based on a least-mean-square approximation). There are two comparators in the diagram with offsets set to $+\alpha$ and $-\alpha$, respectively, representing the residual value of the previous bit. If the previous bit is 1, the residual is positive. If the previous bit is $-1$, the residual is negative.

The signal amplitude of the current data is based on the current value plus the residual value of the previous bit. If the current bit is 1, then the amplitude could be either $1+\alpha$ or $1-\alpha$. If the current bit is $-1$, then the amplitude could be either $-1+\alpha$ or $-1-\alpha$. If $1+\alpha$ or $1-\alpha$ is larger than $+\alpha$, the top comparator will output a 1. If $-1+\alpha$ or $-1-\alpha$ is less than $-\alpha$, the bottom comparator will output a 1. Which value the LUDFE chooses depends on whether the previous bit is 1 or $-1$. If the previous bit is $-1$, the LUDFE chooses the result of the bottom comparator. If previous bit is 1, the LUDFE chooses the result of the top comparator. Both results are pre-computed regardless of the value of the previous bit, so this structure saves time compared with a direct feedback DFE structure in which the current value is modified only after the previous bit is known.

Figure 5:
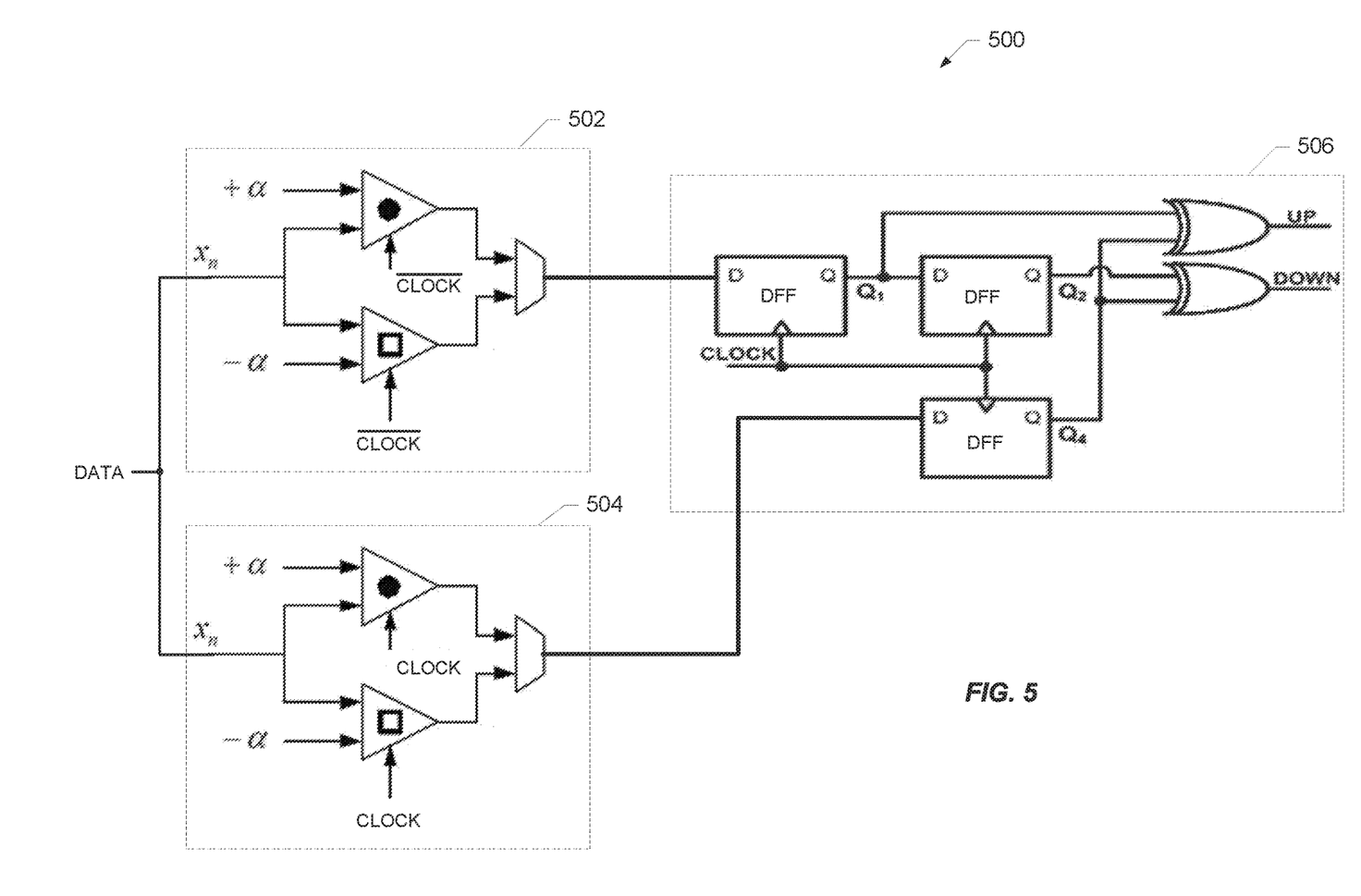
FIG. 5 is a simplified block diagram of a particular implementation of a combined decision feedback equalizer and phase detector (DFE/PD).

An example of a combined decision feedback equalizer/phase detector (DFE/PD) enabled by the present disclosure is shown in FIG. 5. Combined DFE/PD 500 receives the incoming DATA signal (e.g., from a preceding continuous-time linear equalizer or CTLE) with DFE circuitry 502 and DFE circuitry 504, the latter being clocked with the CLOCK signal generated by the clock and data recovery (CDR) circuitry, and the former being clocked with the inverse of that signal, i.e., $\overline{\text{CLOCK}}$. Circuitry 502 and 504 are each similar to the LUDFE depicted in FIG. 4 but without the D flip-flop latch at their outputs.

The outputs of circuitry 502 and 504 feed different signal paths of PD circuitry 506. PD circuitry 506 is a modified phase detector in which, relative to the Alexander phase detector depicted in FIG. 2, the lower-left-hand D flip-flop (DFF3) has been removed with the output of DFE circuitry 504 feeding the D flip-flop that generates Q4. Because of the depicted clocking scheme, data (Q1, Q2, and Q4) are created on three consecutive clock edges.

By combining the DFE circuitry with the PD circuitry, the clock used by the PD circuitry (e.g., the CDR clock) is also the clock used by the DFE circuitry. Use of the same clock by these circuits becomes transparent to the data path with the result that the output of the DFE circuitry aligns with the clock in a way that is independent of process, temperature, or voltage supply variation. It is also a result that the DFE circuitry output may be used directly by the CDR circuitry under both unlocked and locked conditions. Thus, all three of the issues discussed above with regard to conventional structures are addressed.

Operation of a particular implementation of a combined DFE/PD 600 will now be described with reference to the block diagram of FIG. 6. DFE/PD 600 includes five sense amplifiers I1, I2, I3, I4, and I7; two 2-1 multiplexers I5 and I6; and two flip-flops I8 and I9. In the depicted implementation, I5 functions like a flip-flop. In an alternative implementation, I7 may be implemented using a flip flop rather than a latched sense amplifier.

Sense amplifier I1 samples the incoming data (DATA), comparing its positive and negative differential inputs (inp and inm) upon detecting a negative edge of the clock signal (CLOCK). I1 has a positive offset setting ($+\alpha$). Sense amplifier I2 samples the incoming data, comparing its positive and negative differentials input upon detecting a negative clock edge. I2 has a negative offset setting ($-\alpha$). The negative edge of the clock causes I1 and I2 to sense the input signal and output a high or a low depending on the input level relative to the corresponding offset settings. The outputs of I1 and I2 are connected to a 2-1 multiplexer I5, the output of which connects to sense amplifier (or flip flop) I7. A positive clock signal will latches the signal at the output of I5 to the output of I7. The output of I7 is used to select the output of I5 for the next positive edge.

Sense amplifier I3 samples the incoming data, comparing its positive and negative differential inputs upon detecting a positive clock edge. I3 has a positive offset setting ($+\alpha$). Sense amplifier I4 samples the incoming data, comparing its positive and negative differential inputs upon detecting a positive clock edge. I4 has a negative offset setting ($-\alpha$). The positive edge of the clock (because of I10 which may be an inverter) causes I3 and I4 to sense the input signal and output a high or a low depending on the input level relative to the corresponding offset settings. The outputs of I3 and I4 are connected to a 2-1 multiplexer I6, the output of which connects to flip-flop I9. A positive clock signal latches the signal at the output of I6 to the output of I9.

I1 through I10 collectively generate three outputs (S1, S2, and S3) sampled at three consecutive clock transitions. For purposes of illustration and referring to the Alexander phase detector of FIGS. 2 and 3, S1 can be analogized to Q2, S2 to Q4, and S3 to Q1. Outputs S1, S2, and S3 are processed by early/late decode logic (not shown for purposes of clarity) to generate the up/down signal for the charge pump in the CDR loop. When S1=S2 and S2≠S3, the clock edge lags the data edge and an up control signal is asserted. When S1≠S2 and S2=S3, the clock edge leads the data edge and a down control signal is asserted.

Figure 6:
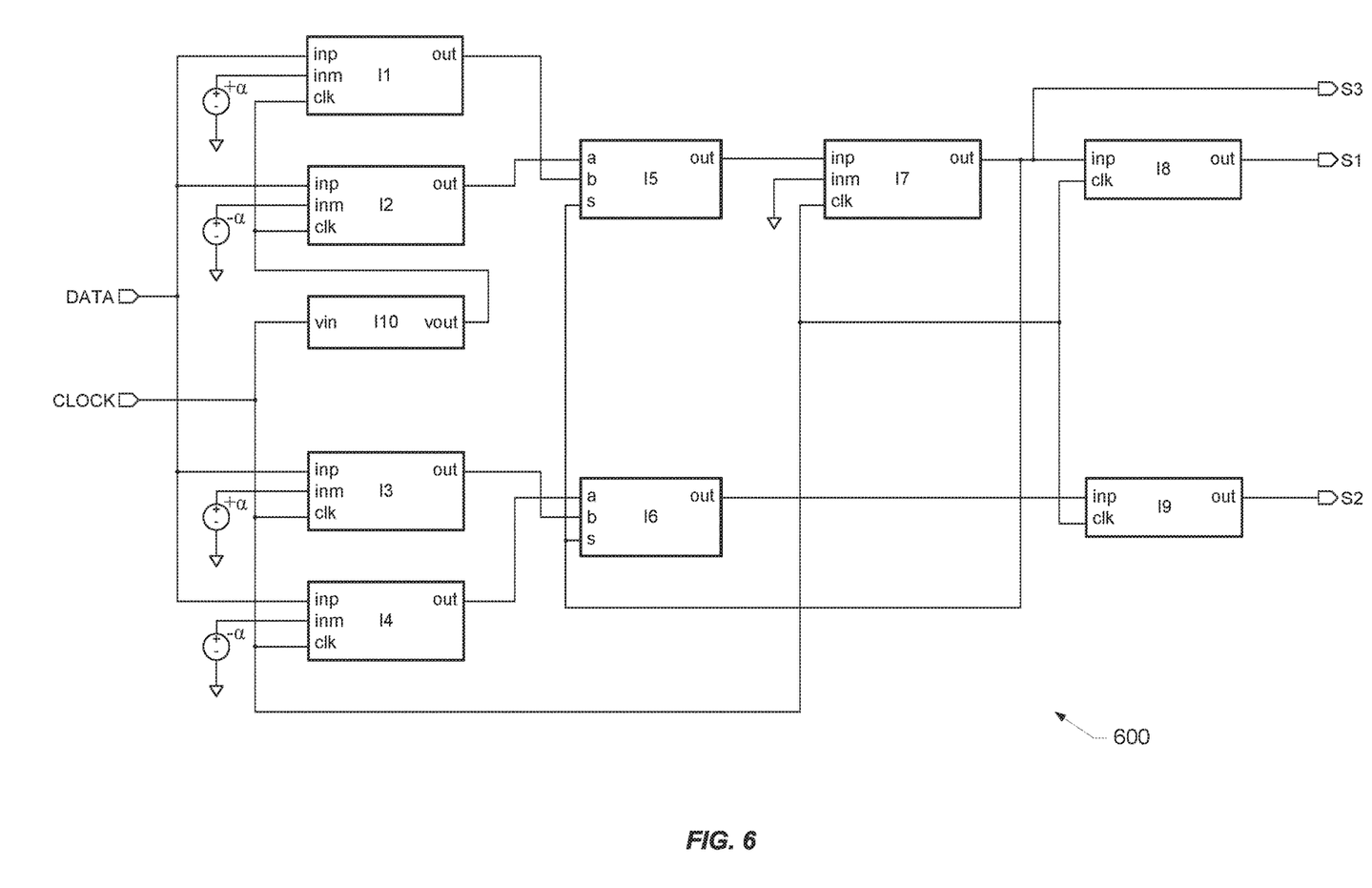
FIG. 6 is a simplified block diagram of a particular implementation of a combined decision feedback equalizer and phase detector (DFE/PD).

The input data edge generated by CDR circuitry (not shown) using the output of the combined DFE/PD of FIG. 6 will align the CLOCK negative edge to the data transition edge and align the positive edge of CLOCK with the center of the data.

Operation of a particular implementation of a combined DFE/PD 700 will now be described with reference to the block diagram of FIG. 7. A conventional one-tap LUDFE uses a positive edge clock to sample the data, whereas in a conventional Alexander phase detector, both clock edges are needed to sample the data in order to get the edge and data center for three consecutive clock edges for comparison. A conventional one-tap loop LUDFE structure can therefore only satisfy half of the requirement of the Alexander phase detector for data sampling.

Figure 7:
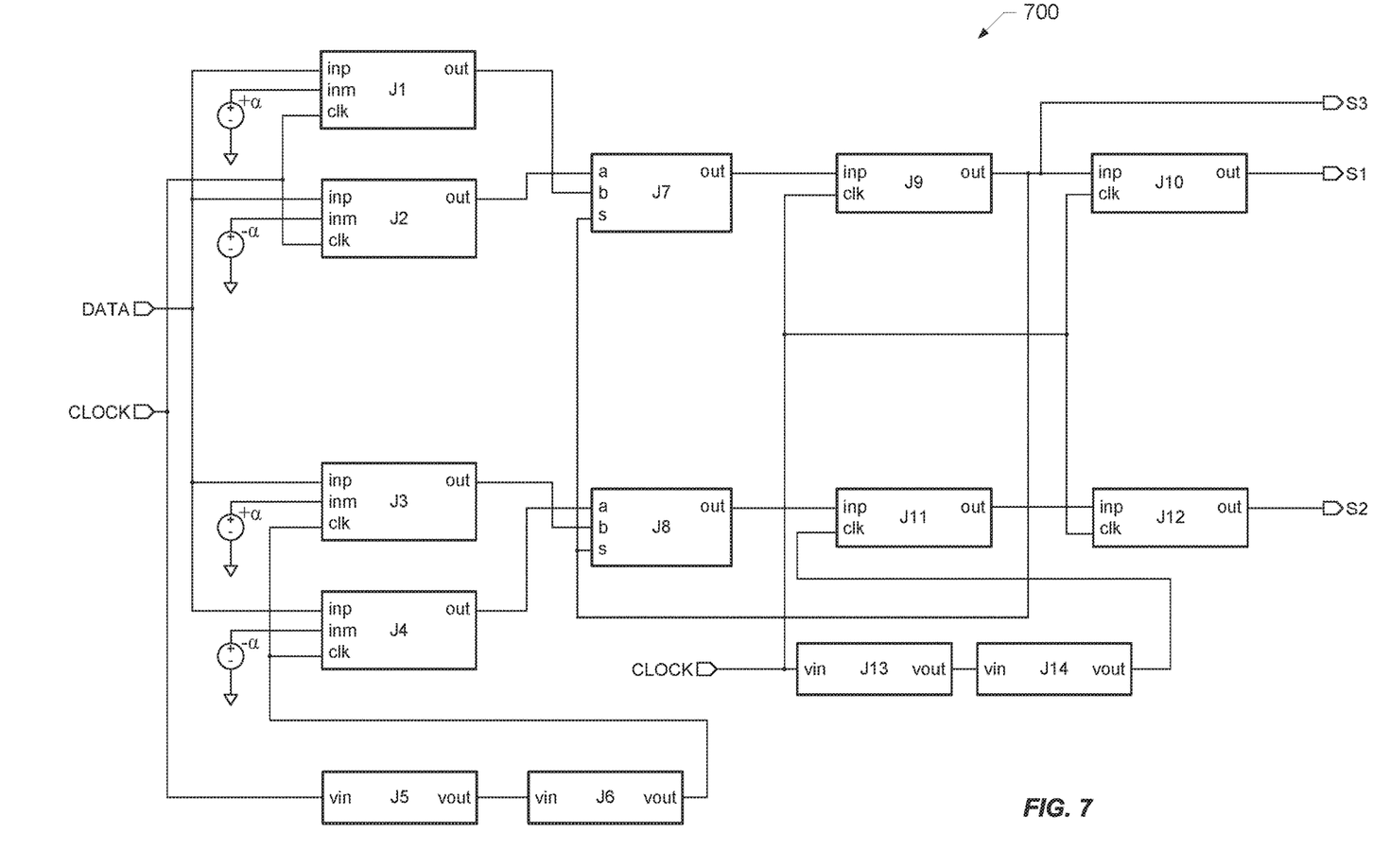
FIG. 7 is a simplified block diagram of a particular implementation of a combined decision feedback equalizer and phase detector (DFE/PD).

According to a particular implementation illustrated in FIG. 7, the clocked comparator and multiplexer structure of an LUDFE is duplicated (without the D latch), and the clock input of the clocked comparator is connected to the inverted clock to clock the data at the negative clock edge. This generates data for two positive edges and the negative clock edge in between the two positive clock edges.

This clock-aligned LUDFE phase detector (CALUDFE/PD) integrates an LUDFE structure into a bang bang phase detector, with the clock of the bang bang phase detector being used as the CALUDFE-PD clock. Using the same clock as the PD, the LUDFE structure becomes transparent to the data path and the LUDFE structure output aligns with the clock independent of process, temperature, and voltage supply variation. The output of the LUDFE structure may also be used directly by the CDR under both unlocked and locked conditions.

The CALUDFE-PD depicted in FIG. 7 includes four sense amplifiers J1-J4, two 2-1 multiplexers J7 and J8, and four flip-flops J9-J12. Sense amplifier J1 samples the incoming data, comparing its positive and negative differential inputs upon detecting a positive clock edge. J1 has a positive offset setting ($+\alpha$). Sense amplifier J2 samples the incoming data, comparing its positive and negative differential inputs upon detecting a positive clock edge. J2 has a negative offset setting ($-\alpha$). The positive edge of the clock causes J1 and J2 to sense the input signal and output a high or a low depending on the input level relative to the corresponding offset settings. The outputs of J1 and J2 are connected to a 2-1 multiplexer J7. The output of multiplexer J7 connects to flip-flop J9. A positive clock signal latches the signal at the output of J7 to the output of J9. The output of J9 is used to select the output of J7 for the next positive edge.

J5 acts as an inverter that inverts the clock input (CLOCK) such that a rising clock edge becomes a falling clock edge and a falling clock edge becomes a rising clock edge. J6 adds a delay such that J5 and I6 act in combination as an inverter with delay. J13 and J14 are similarly implemented.

Sense amplifier J3 samples the incoming data, comparing its positive and negative differential inputs upon detecting a negative clock edge (via the output of J6). J3 has a positive offset setting ($+\alpha$). Sense amplifier J4 samples the incoming data, comparing its positive and negative differential inputs upon detecting a negative clock edge via (the output of J6). J4 has a negative offset setting ($-\alpha$). The positive clock edge at the output of J6 causes J3 and J4 to sense the input signal and output a high or a low depending on the input level relative to the corresponding offset settings. The outputs of J3 and J4 are connected to 2-1 multiplexer J8. The output of multiplexer J8 is connected to flip-flop J11. A negative edge clock signal (via J13 and J14) latches the signal at the output of J8 to the output of J11. J12 is a rising edge flip-flop. A rising clock edge clocks the input of J12 to its output.

J1 through J14 collectively generate three outputs (S1, S2, and S3) sampled at three consecutive clock transitions. For purposes of illustration and referring to the Alexander phase detector of FIGS. 2 and 3, S1 can be analogized to Q2, S2 to Q4, and S3 to Q1. The three consecutive edge data are synchronized by J9 and J11, giving each clock comparator a full clock cycle for settling. This is to be contrasted with the circuit of FIG. 6 in which I1 and I2 are clocked by the rising edge of clock, and I7 and I8 the falling edge, therefore providing only a half clock cycle settling time for I1 and I2 before the data is clocked by I7.

Referring back to FIG. 7, outputs S1, S2, and S3 are processed by early/late decode logic (not shown for purposes of clarity) to generate the up/down signal for the charge pump in the CDR loop. When S1=S2 and S2≠S3, the clock edge lags the data edge and the up control signal is asserted. When S1≠S2 and S2=S3, the clock edge leads the data edge and the down control signal is asserted.

The input data edge generated by the CDR circuitry using the output of the CALUDFE-PD aligns the negative edge of CLOCK to the data transition edge and aligns the positive edge of CLOCK with the center of the data.

It will be understood by those skilled in the art that changes in the form and details of the implementations described herein may be made without departing from the scope of this disclosure. In addition, although various advantages, aspects, and objects have been described with reference to various implementations, the scope of this disclosure should not be limited by reference to such advantages, aspects, and objects. Rather, the scope of this disclosure should be determined with reference to the appended claims.

What is claimed is:

1. A circuit, comprising:
    first decision feedback equalizer (DFE) circuitry configured to receive an input signal and generate a first intermediate data signal;
    second DFE circuitry configured to receive the input signal and generate a second intermediate data signal; and
    phase detector circuitry configured to receive the first and second intermediate data signals and generate three phase difference signals using a clock signal derived from the input signal, the three phase difference signals representing three samples of the input signal corresponding to three consecutive transitions of the clock signal;
    wherein operation of the first DFE circuitry, the second DFE circuitry, and the phase detector circuitry is synchronized using the clock signal.

2. The circuit of claim 1, wherein the phase detector circuitry includes a first flip-flop and a second flip-flop connected in series, the first flip-flop being configured to generate a first one of the phase difference signals based on the first intermediate data signal, the second flip-flop being configured to generate a second one of the phase difference signals based on the first phase difference signal, the phase detector also including a third flip-flop configured to generate a third one of the phase difference signals based on the second intermediate data signal.

3. The circuit of claim 1, wherein the second DFE circuitry is clocked with the clock signal, and the first DFE circuitry is clocked with an inverted version of the clock signal.

4. The circuit of claim 1, further comprising logic configured to receive the three phase difference signals and generate one or more timing signals representing relative timing of transitions of the clock signal and transitions of data encoded in the input signal.

5. The circuit of claim 1, wherein the phase detector circuitry is part of clock and data recovery (CDR) circuitry, the CDR circuitry being configured to generate the clock signal.

6. The circuit of claim 5, wherein the CDR circuitry is configured to generate the clock signal using the circuit such that a transition of the input signal representing an edge of a data bit is aligned with a first transition of the clock signal, and a second transition of the clock signal is aligned with a center of the data bit.

7. The circuit of claim 5, wherein the first DFE circuitry, the second DFE circuitry, and the phase detector circuitry are configured to generate the three phase difference signals whether or not the CDR circuitry is locked to data in the input signal.

8. The circuit of claim 1, wherein the first DFE circuitry, the second DFE circuitry, and the phase detector circuitry are integrated in a single semiconductor die.

9. The circuit of claim 1, wherein both the first DFE circuitry and the second DFE circuitry are configured to settle within one clock cycle of the clock signal.

10. The circuit of claim 1, wherein the first DFE circuitry is configured to settle within one-half clock cycle of the clock signal, and the second DFE circuitry is configured to settle within one clock cycle of the clock signal.

11. The circuit of claim 1, wherein the phase detector circuitry includes a first flip-flop and a second flip-flop connected in series, the first flip-flop being configured to generate a first one of the phase difference signals based on the first intermediate data signal, the second flip-flop being configured to generate a second one of the phase difference signals based on the first phase difference signal, the phase detector also including a third flip-flop and a fourth flip-flop connected in series, the third and fourth flip-flops being configured to generate a third one of the phase difference signals based on the second intermediate data signal.

12. A device, comprising:
a receive port configured to receive an input signal via a transmission medium;
clock and data recovery (CDR) circuitry configured to receive the input signal and generate a clock signal, the CDR circuitry including:
first decision feedback equalizer (DFE) circuitry configured to receive the input signal and generate a first intermediate data signal;
second DFE circuitry configured to receive the input signal and generate a second intermediate data signal;
phase detector circuitry configured to receive the first and second intermediate data signals and generate three phase difference signals using a clock signal derived from the input signal, the three phase difference signals representing three samples of the input signal corresponding to three consecutive transitions of the clock signal, wherein operation of the first DFE circuitry, the second DFE circuitry, and the phase detector circuitry is synchronized using the clock signal;
logic configured to receive the three phase difference signals and generate one or more timing signals representing relative timing of transitions of the clock signal and transitions of data encoded in the input signal;
a charge pump controlled by the one or more timing signals; and
a voltage controlled oscillator controlled by the charge pump.

13. The device of claim 12, further comprising a second receive port, and either a second instance of the CDR circuitry, or multiplexer circuitry configured to alternately connect the CDR circuitry with the first receive port or the second receive port.

14. The device of claim 12, wherein the phase detector circuitry includes a first flip-flop and a second flip-flop connected in series, the first flip-flop being configured to generate a first one of the phase difference signals based on the first intermediate data signal, the second flip-flop being configured to generate a second one of the phase difference signals based on the first phase difference signal, the phase detector also including a third flip-flop configured to generate a third one of the phase difference signals based on the second intermediate data signal.

15. The device of claim 12, wherein the second DFE circuitry is clocked with the clock signal, and the first DFE circuitry is clocked with an inverted version of the clock signal.

16. The device of claim 12, wherein the CDR circuitry is configured to generate the clock signal such that a transition of the input signal representing an edge of a data bit is aligned with a first transition of the clock signal, and a second transition of the clock signal is aligned with a center of the data bit.

17. The device of claim 12, wherein first DFE circuitry, the second DFE circuitry, and the phase detector circuitry are configured to generate the three phase difference signals whether or not the CDR circuitry is locked to data in the input signal.

18. The device of claim 12, wherein the first DFE circuitry, the second DFE circuitry, the phase detector circuitry, the logic, the charge pump, and the voltage controlled oscillator are integrated in a single semiconductor die.

19. The device of claim 12, wherein the both first DFE circuitry and the second DFE circuitry are configured to settle within one clock cycle of the clock signal.

20. The device of claim 12, wherein the first DFE circuitry is configured to settle within one-half clock cycle of the clock signal, and the second DFE circuitry is configured to settle within one clock cycle of the clock signal.

21. The device of claim 12, wherein the phase detector circuitry includes a first flip-flop and a second flip-flop connected in series, the first flip-flop being configured to generate a first one of the phase difference signals based on the first intermediate data signal, the second flip-flop being configured to generate a second one of the phase difference signals based on the first phase difference signal, the phase detector also including a third flip-flop and a fourth flip-flop connected in series, the third and fourth flip-flops being configured to generate a third one of the phase difference signals based on the second intermediate data signal.

22. A device, comprising:
a receive port configured to receive an input signal via a transmission medium, the input signal being compliant with a serial data protocol;
clock and data recovery (CDR) circuitry configured to receive the input signal and generate a clock signal, the CDR circuitry including:
first loop-unroll decision feedback equalizer (LUDFE) circuitry configured to receive the input signal and generate a first intermediate data signal;
second LUDFE circuitry configured to receive the input signal and generate a second intermediate data signal;
phase detector circuitry configured to receive the first and second intermediate data signals and generate three phase difference signals using a clock signal derived from the input signal, the three phase difference signals representing three samples of the input signal corresponding to three consecutive transitions of the clock signal, wherein operation of the first LUDFE circuitry, the second LUDFE circuitry, and the phase detector circuitry is synchronized using the clock signal, and wherein first LUDFE circuitry, the second LUDFE circuitry, and the phase detector circuitry are configured to generate the three phase difference signals whether or not the CDR circuitry is locked to data in the input signal;

logic configured to receive the three phase difference signals and generate one or more timing signals representing relative timing of transitions of the clock signal and transitions of data encoded in the input signal;

a charge pump controlled by the one or more timing signals; and a voltage controlled oscillator controlled by the charge pump.

* * * * *